(12) United States Patent
Kim

(10) Patent No.: US 6,423,637 B2
(45) Date of Patent: Jul. 23, 2002

(54) METHOD OF MANUFACTURING COPPER WIRING IN A SEMICONDUCTOR DEVICE

(75) Inventor: Heon Do Kim, Kyungki-Do (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/875,687

(22) Filed: Jun. 6, 2001

(30) Foreign Application Priority Data

Jun. 29, 2000 (KR) ............................................. 00-36525

(51) Int. Cl.[7] .............................................. H01L 21/44

(52) U.S. Cl. ........................ 438/687; 438/629; 438/643

(58) Field of Search .................................. 438/304, 305, 438/629, 643, 653, 677, 687

(56) References Cited

U.S. PATENT DOCUMENTS

| | | | | | |
|---|---|---|---|---|---|
| 5,913,147 | A | * | 6/1999 | Dublin et al. | 438/687 |
| 6,136,707 | A | * | 10/2000 | Cohen | 438/687 |
| 6,174,796 | B1 | * | 3/2001 | Takagi et al. | 438/622 |
| 6,197,181 | B1 | * | 3/2001 | Chen | 205/123 |
| 6,352,926 | B1 | * | 3/2002 | Ding et al. | 438/687 |

* cited by examiner

Primary Examiner—Carl Whitehead, Jr.
Assistant Examiner—Jeff Vockrodt
(74) Attorney, Agent, or Firm—Marshall, Gerstein & Borun.

(57) ABSTRACT

A method of manufacturing copper wiring in a semiconductor device by forming a diffusion prevention film on a damascene pattern, forming a first copper film by a PVD method, forming a second copper film by a spin-on coating method, and forming a third copper film by a PVD or electrochemical deposition method. The method provides a good coverage characteristic and can prevent generation of voids etc., thus improving reliability of the device.

13 Claims, 2 Drawing Sheets

METHOD OF MANUFACTURING COPPER WIRING IN A SEMICONDUCTOR DEVICE

BACKGROUND OF THE INVENTION

1. Field of the Invention

The invention relates generally to a method of manufacturing copper wiring in a semiconductor device. More particularly, the invention relates to a method of manufacturing copper wiring in a semiconductor device, which has a good coverage characteristic and can prevent generation of voids, etc., and thus is capable of improving reliability of a device, by which a diffusion prevention film is formed on a damascene pattern, a first copper film is formed by a PVD method, a second copper film is formed by a spin-on coating method, and a third copper film is formed by PVD or an electrochemical deposition method.

2. Description of the Prior Art

A prior art method of manufacturing a copper wiring in a conventional semiconductor device is explained below with reference to FIG. 1.

An insulating film 12 is formed on a semiconductor substrate 11 in which a predetermined structure is formed. Then, a predetermined region of the insulating film 12 is patterned by a dual damascene process to form a trench through which the predetermined region of the semiconductor substrate is exposed. Next, a diffusion prevention film 13 is formed on the entire structure, including the trench. Thereafter, a seed layer 14 is formed by means of a PVD method. Then, a copper film 15 is formed by an electrochemical deposition method so that the trench can be completely filled. Next, after the copper film 15 is cured by an annealing process, it is polished by a CMP process to form copper wiring.

If the copper wiring is formed by the above process, the coverage characteristics of the diffusion prevention film and the seed layer formed by CVD method are degraded as the device is highly integrated. Therefore, the diffusion prevention does not function properly or copper atoms 16 enter the insulating film through the diffusion prevention film. Due to this, when the copper layer is formed by an electrochemical deposition method, a void 17 is created which adversely affects reliability of the wiring.

Also, the copper layer is formed by an electrochemical deposition method after the diffusion prevention film and the seed layer are formed, and breakage of vacuum is caused to form a copper oxide film 18 on the seed layer. Therefore, even after the copper layer is deposited by an electrochemical deposition method, the copper oxide film 18 exists within the wiring, thus adversely affecting reliability of the device. In addition, as the copper layer formed by electrochemical deposition is formed using additives, many impurities exist in the deposited copper layer to adversely affect the copper metal layer.

It is expected that as the device is highly integrated, the conventional method becomes difficult to use. Therefore, there is a need for a copper wiring method that has better coverage and results in fewer impurities.

SUMMARY OF THE INVENTION

A method of manufacturing a copper wiring in a semiconductor device includes the steps of forming an insulating film on a semiconductor substrate in which a given structure such as an underlying conductive film is formed, and then sputtering the insulating film by a dual damascene process to form a trench through which the underlying conductive layer of the semiconductor substrate is exposed; removing a metal oxide film remaining on the exposed underlying conductive layer to form a diffusion prevention film; after forming a first copper film on the entire structure, forming a second copper film and performing an annealing process until a desired thickness is formed, thus forming a copper oxide film on the second copper film; removing the copper oxide film to form a third copper film on the entire structure; and polishing the third, second and first copper films, and the diffusion prevention film by CMP process to form a copper wiring.

DETAILED DESCRIPTION OF PREFERRED EMBODIMENTS

It is an objective of the disclosure to provide a method of manufacturing a copper wiring in a semiconductor device that has better coverage and fewer impurities.

A method of manufacturing a copper wiring uses a spin-on coating method and a PVD method. A diffusion prevention film formed using the CVD method can improve a coverage characteristic, a copper layer deposited using spin-on coating method can solve the problems of the PVD method, and a flat copper layer formed by PVD method can improve the characteristic of a deposited copper layer.

The present invention will be described in detail by way of a preferred embodiment with reference to accompanying drawings.

Figure 1:
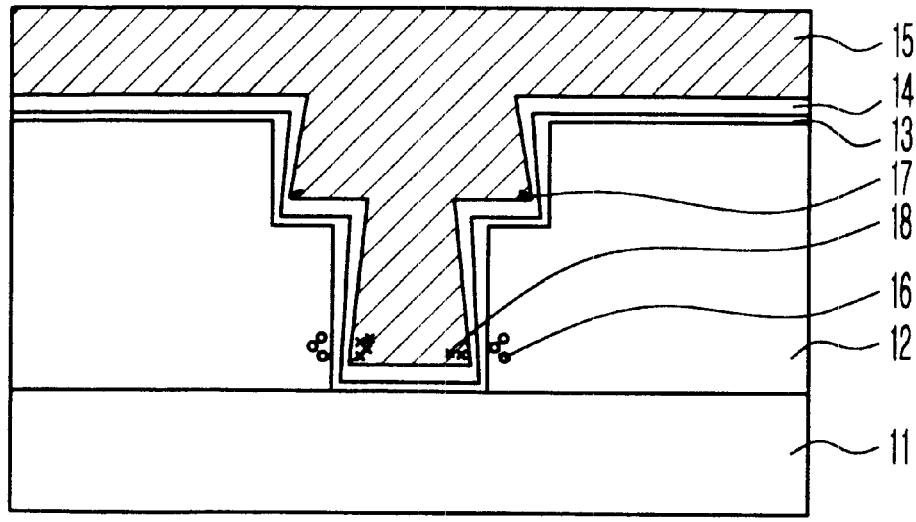
FIGS. 1 is a cross-sectional view for explaining a method of manufacturing a copper wiring in a conventional semiconductor device.
Figure 2A:
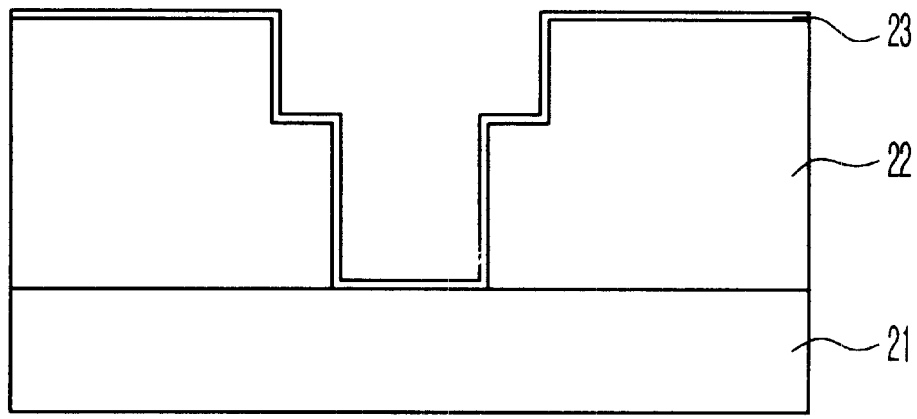
FIGS. 2A to 2D are cross-sectional views for explaining a method of manufacturing a copper wiring in a semiconductor device according to the present invention.

Referring to FIG. 2A, an insulating film 22 is formed on a semiconductor substrate 21 in which a predetermined structure such as an underlying conductive layer, etc. is formed. Then, a predetermined region of the insulating film 22 is patterned by a dual damascene method, thus forming a trench through which the underlying conductive layer of the semiconductor substrate 21 is exposed. After a metal oxide film formed on the underlying conductive layer is removed, a diffusion prevention film 23 is formed by a CVD method without vacuum breakage. With this process, a uniform coverage is obtained to prevent copper from diffusing. In order to remove a metal oxide film in the underlying conductive layer, inert reduction gases such as a mixture gas of $H_2$ and Ar or a mixture gas of $H_2$ and He, etc. are used. Also, the diffusion prevention film may be formed using materials such as Ta, TaN, TiAlN, WN, TiSiN, WBN, TaSiN, etc. and is formed in a thickness of less than 100 Å.

Figure 2B:
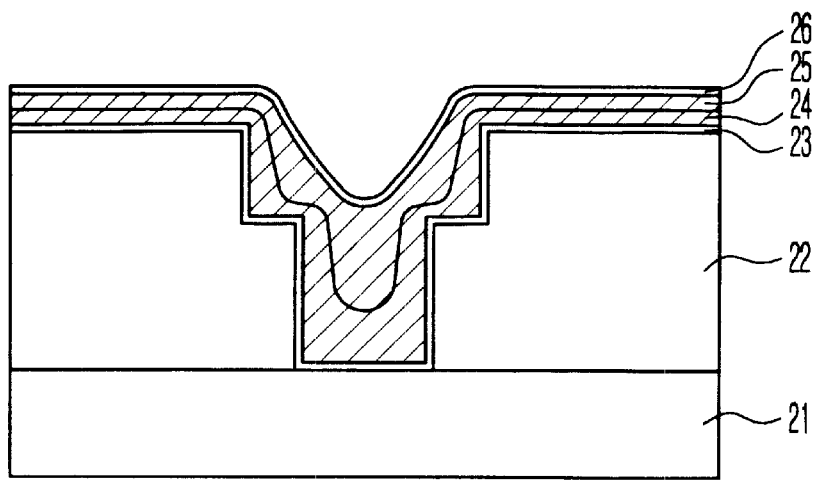

Referring to FIG. 2B, after a first copper film 24 is formed on the entire structure by a PVD method without a vacuum breakage, a second copper film 25 is formed by spin-on coating method and is cured by an annealing process. The second copper film 24 is formed in thickness of less than 100 Å. The second copper film 25 is formed in a thickness of about 500 Å to about 2000 Å by spin-on laminating copper-containing organic solvent. The annealing process is performed for removing the organic solvent after the second copper film 25 is formed, which is sequentially performed in the coating equipment at a temperature of about 100° C. to about 350° C. If this annealing process is performed, contraction of its volume is caused due to vaporization of the solvent, thus forming a copper film having a high density.

The spin-coating process and the annealing process are repeatedly performed until a desired thickness is obtained. If these processes are performed, a copper oxide film 26 is formed on the second copper film 25 formed by the coating. Meanwhile, after the second copper film 25 is formed by a spin-on coating method, it is cured by an annealing process in annealing equipment at a temperature of about 350° C. to about 450° C. under argon or a mixture gas of argon and hydrogen atmosphere for about 10 minutes to about 60 minutes.

Figure 2C:
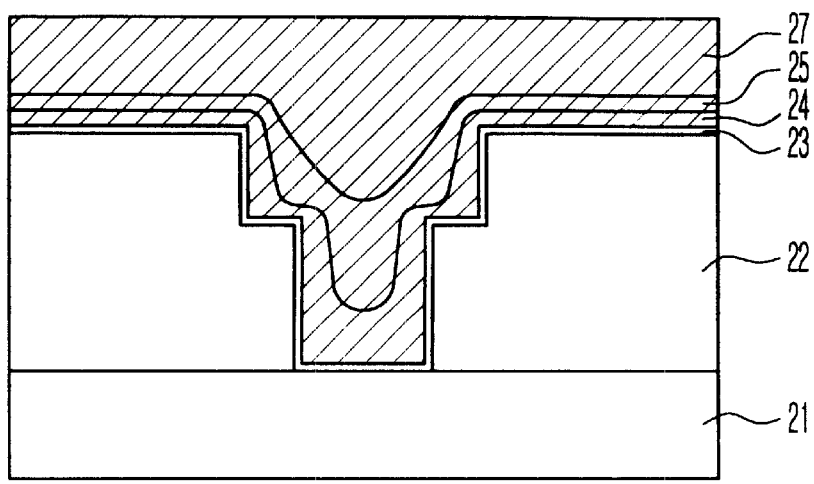

Referring to FIG. 2C, after the second copper film 25 is formed, a plasma process is performed using a reduction gas such as hydrogen at the etching chamber of sputtering equipment. Then, the copper oxide film 26 formed on the second copper film 25 is completely removed. Next, a third copper film 27 flattened by a PVD method is formed on the entire structure. The third copper film 27 is formed with the temperature of a wafer maintained in the range of about 300° C. to about 450° C. in order to maintain diffusion of copper and characteristic of the insulating film, and the thickness thereof is in the range of about 5000 Å to about 15000 Å for facilitating a subsequent CMP process. The copper film deposited at high temperature as above, has a higher degree of purity in a copper metal than that by the electrochemical deposition and has a coarse crystal particle. Thus, it does not need an additional annealing process.

Figure 2D:
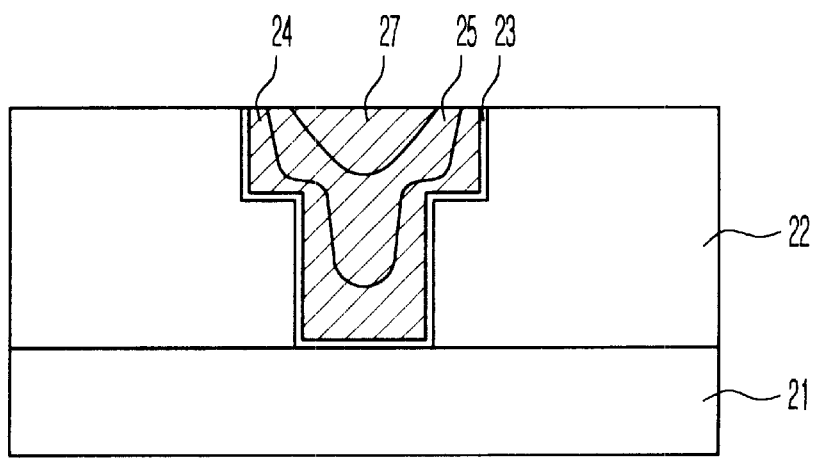

Referring to FIG. 2D, unnecessary copper and diffusion prevention film are removed by CMP. After the CMP process is performed, a process of protecting copper may be performed while the surface of copper is reduced using a gas such as $NH_3$.

In the above, meanwhile, though the flattened third copper film is formed by PVD method, the third copper film may be formed by an electrochemical deposition.

As mentioned above, the method can form copper wiring having a very low CuO content since it forms all the copper films using the equipment used conventionally, and does not require an additional annealing process for a copper film of a fine structure since it forms a copper film at high temperature without forming the copper film by an electrochemical method. Also, it can form a copper film having reliability of a wiring improved since it performs several annealing processes.

The method has been described with reference to a particular embodiment in connection with a particular application. Those having ordinary skill in the art and access to the teachings of the disclosure will recognize additional modifications and applications within the scope thereof.

It is therefore intended by the appended claims to cover any and all such applications, modifications, and embodiments within the scope of the invention.

What is claimed is:

1. A method of manufacturing copper wiring in a semiconductor device, comprising the steps of:
    providing a semiconductor substrate in which a predetermined structure is formed, said substrate having an underlying conductive layer,
    forming an insulating film on said substrate, patterning said insulating film by a dual damascene process to form a trench through which the underlying conductive layer of said semiconductor substrate is exposed, said conductive layer having a metal oxide film remaining thereon;
    removing the metal oxide film remaining on the exposed underlying conductive layer;
    forming a diffusion prevention film;
    forming a first copper film on the entire structure;
    thereafter forming a second copper film and performing an annealing process until a desired thickness is formed, thus forming a copper oxide film on said second copper film;
    removing said copper oxide film;
    forming a third copper film on the entire structure; and
    polishing said third, second, and first copper films, and said diffusion prevention film by a CMP process to form copper wiring.

2. The method of claim 1, comprising the step of removing said metal oxide film remaining on said underlying conductive layer using a gaseous mixture of $H_2$ and Ar or a gaseous mixture of $H_2$ and He.

3. The method of claim 1, wherein said diffusion prevention film is formed a film selected from the group consisting of Ta films, TaN films, TiAlN films, WN films, TiSiN films, WBN films, and TaSiN films by a CVD method.

4. The method of claim 1, comprising the step of forming said diffusion prevention film in a thickness below 100 Å.

5. The method of claim 1, comprising the step of forming said first copper film in a thickness below 100 Å by a PVD method.

6. The method of claim 1, comprising the step of forming said second copper film in a thickness of about 500 Å to about 2000 Å by spin-on laminating a copper-containing organic solvent.

7. The method of claim 1, comprising the step of sequentially performing said annealing process at a temperature of about 100° C. to about 350° C. in the coating equipment.

8. The method of claim 1, further including an annealing process is carried out in annealing equipment at a temperature of about 350° C. to about 450° C. under an atmosphere of argon or a mixture gas of argon and hydrogen for about 10 minutes to about 60 minutes, after said second copper film is formed.

9. The method of claim 1, comprising the step of removing said copper oxide film by performing a plasma process using reduction gas in an etching chamber of sputtering equipment.

10. The method of claim 1, further including, after said CMP process is performed, the step of performing a process of protecting the surface of copper while it is reduced using a $NH_3$ gas.

11. The method of claim 1, comprising the step of forming said third copper layer in a thickness of about 5000 Å to about 15000 Å with the substrate maintained at a temperature of about 300° C. to about 450° C.

12. The method of claim 11, further including, after said CMP process is performed, the step of performing a process of protecting the surface of copper while it is reduced using a $NH_3$ gas.

13. The method of claim 1, comprising the step of forming said third copper film by an electrochemical deposition method.

* * * * *